United States Patent
Nakayama

(10) Patent No.: US 6,821,686 B2
(45) Date of Patent: Nov. 23, 2004

(54) METHOD OF DEFECT REPAIRING IN GRAYTONE PART IN GRAYTONE MASK

(75) Inventor: Kenji Nakayama, Kumamoto (JP)

(73) Assignee: Hoya Corporation, Tokyo (JP)

( * ) Notice: Subject to any disclaimer, the term of this patent is extended or adjusted under 35 U.S.C. 154(b) by 117 days.

(21) Appl. No.: 10/107,817

(22) Filed: Mar. 28, 2002

(65) Prior Publication Data

US 2003/0186130 A1 Oct. 2, 2003

(51) Int. Cl.$^7$ .............................................. G03F 9/00
(52) U.S. Cl. ............................................................ 430/5
(58) Field of Search ........................ 430/5; 250/492.21, 250/492.22, 492.3; 356/239.3, 239.9

(56) References Cited

U.S. PATENT DOCUMENTS 6,335,129 B1 * 1/2002 Asano et al. .................. 430/5

* cited by examiner

*Primary Examiner*—S. Rosasco
(74) *Attorney, Agent, or Firm*—Sughrue Mion, PLLC

(57) ABSTRACT

Repairing patterns 3a' and 3b' different in width and position respectively from regular patterns 3a and 3b by partially removing a repairing film 8 in the form and/or the disposition of achieving a graytone effect equal to the graytone effect of a regular pattern after forming the repairing film 8 in an area containing clear defects.

14 Claims, 7 Drawing Sheets

METHOD OF DEFECT REPAIRING IN GRAYTONE PART IN GRAYTONE MASK

BACKGROUND OF THE INVENTION

1. Field of the Invention

The present invention relates to defect repairing in a graytone part in a graytone mask.

2. Description of the Related Art

In recent years, attempts have been made to reduce the number of mask sheets by using graytone masks in the field of large-sized LCD masks (as set forth in the monthly FPD Intelligence, May, 1999).

As shown in FIG. 8A, such a graytone mask has an opaque part 1, a transmission part 2 and a graytone part 3. The graytone part 3 corresponds to an area in which there is formed an opaque pattern 3a of below or equal to the resolution limit of an exposure apparatus for a large-sized LCD using the graytone mask and is designed to selectively change the thickness of a photoresist film by decreasing the light transmitted through this area so as to decrease the amount of irradiation due to the area. Normally, the opaque part 1 and the opaque pattern 3a are formed with films that are made of the same material such as chromium (Cr) or a chromium compound and have the same thickness.

The resolution limit of the exposure apparatus for the large-sized LCD using the graytone mask is about 3 $\mu$m in the case of an exposure apparatus of a stepper type and about 4 $\mu$m in the case of an exposure apparatus of a mirror projection type. Consequently, the space width of a transmission part 3b in the graytone part of FIG. 8A is set at less than 3 $\mu$m and the line width of the opaque pattern 3a of below or equal to the resolution limit of the exposure apparatus is set at less than 3 $\mu$m, for example. When the exposure apparatus for the large-sized LCD is used for light exposure, as the exposure light transmitted through the graytone part 3 as a whole is deficient in the amount of light exposure, positive photoresists are left on a substrate though the thickness of the positive photoresists exposed to light via the graytone part 3 solely decreases. More specifically, there arises a difference in solubility of resists in developing liquid between parts corresponding to the ordinary opaque part 1 and to the graytone part because of difference in the amount of light exposure and this results in, as shown in FIG. 8B, making a part 1' corresponding to the ordinary opaque part 1 as thick as about 1.3 $\mu$m, making a part 3' corresponding to the graytone part 3 as thick as about 0.3 $\mu$m and making a part corresponding to the transmission part 2 a part 2' without resists, for example. A first etching of a substrate as a workpiece is carried out in the part 2' without the resists so as to remove the resists in the thin part 3' corresponding to the graytone part 3 by ashing and the like and by carrying out a second etching of this part, the etching process is performed with one mask instead of two masks as conventionally used in order to reduce the number of masks for use.

The above-mentioned repairing of defects in the graytone part in the graytone mask has been made in pursuit of restoring the same pattern as a regular pattern, that is, restoring the same form as the original one in the defective portion.

A specific conventional method of defect repairing will now be described.

FIG. 10A shows a condition such that the opaque pattern 3a in the graytone part 3 is formed with normal microscopic lines and spaces free from defects (line width=less than 3 $\mu$m and space width=3 $\mu$m).

FIG. 10B shows a condition such that part of the opaque pattern 3a in the graytone part 3 is missing.

FIG. 10C shows a conventional method of defect repairing. In case it is attempted to repair the defects by restoring the same line width as that of the normal opaque pattern 3a as in the prior art, since the line width of the normal opaque pattern 3a is as small as approximately 1 $\mu$m. the formation of a repairing film 4 with the width that can be corrected (e.g., 2 $\mu$m) by a laser CVD apparatus allows the line width in a repairing portion to grow as fat as 3 $\mu$m, thus developing a problem in that a graytone effect equal to that in the regular pattern is unachievable. Moreover, the operation of aligning the position of the repairing film 4 has been troublesome and time-consuming as well. Although it appears to be easy to remove the fat portion of the line at a glance by a laser repair apparatus, there is the possibility of partially scraping the adjoining lines in case where the line alignment is shifted. The operation of not only performing the position alignment but also varying a slit form in conformity with a pattern form to be repaired by means of the laser repair apparatus has also been troublesome and time-consuming.

When it is attempted to restore the same form as that of the regular pattern in case where a opaque defect (e.g., a (short) bridge, a projection, a spot, etc.) is similarly repaired, the operation of not only performing the position alignment but also varying the slit in conformity with each defect size to be corrected by means of the laser CVD apparatus has been troublesome and time-consuming.

As the repairing of the graytone part is exhausting and time-consuming as stated above, it has practically been difficult to do such repairing.

SUMMARY OF THE INVENTION

An object of the invention is to provide a method of readily repairing defects in a graytone part which is practically difficult to repair by a conventional method of defect repairing.

The following arrangements are made according to the invention.

(Arrangement 1) A method of defect repairing in a graytone part in a graytone mask, which has a opaque part, a transmission part and the graytone part aimed at selectively varying the thickness of a photoresist film by decreasing the amount of light transmitted through an area wherein there is formed a opaque pattern of not exceeding the resolution limit of an exposure apparatus using the graytone mask, the method being characterized by forming such a repairing pattern as to make obtainable a graytone effect equal to the graytone effect of a regular pattern without restoring the same form as that of the regular pattern in the defective portion.

(Arrangement 2) A method of opaque defect repairing as described in Arrangement 1 is characterized by removing a film in a portion containing opaque defects to form a form and/or a disposition of achieving a graytone effect equal to the graytone effect of the regular pattern in order to form a repairing pattern different from the regular pattern.

(Arrangement 3) A method of clear defect repairing as described in Arrangement 1 is characterized by forming a repairing film to form a form and/or a disposition of achieving a graytone effect equal to the graytone effect of the regular pattern in order to form a repairing pattern different from the regular pattern.

(Arrangement 4) A method of clear defect repairing as described in Arrangement 1 is characterized by forming the repairing film in an area containing clear defects, then partially removing a repairing film to form a form and/or a disposition of achieving a graytone effect equal to the graytone effect of the regular pattern in order to form a repairing pattern different from the regular pattern.

(Arrangement 5) A method of defect repairing as described in Arrangement 2 is characterized by repairing by pre-fixing a slit form of a laser CVD apparatus for forming a repairing film or a slit form of a laser repair apparatus for removing the film to a slit form for use in achieving a graytone effect.

(Arrangement 6) A method of defect repairing in a graytone part in a graytone mask, which has a opaque part, a transmission part and the graytone part aimed at selectively varying the thickness of a photoresist film by decreasing the amount of light transmitted through an area wherein there is formed a opaque pattern of below or equal to the resolution limit of an exposure apparatus using the graytone mask, the method being characterized by forming a translucent film capable of controlling the amount of light transmitted through the film at least on a clear defective portion.

(Arrangement 7) A method of defect repairing as described in Arrangement 2 is characterized by repairing after removing at least a pattern which is located at periphery of the defect.

(Arrangement 8) A method of defect repairing as described in Arrangement 1 is characterized in that the graytone mask is a mask for an LCD.

According to Arrangement 1, by forming such a repairing pattern as to make obtainable a graytone effect equal to the graytone effect of a regular pattern, the graytone effect equal to the graytone effect of the regular pattern can be obtained without restoring the same form as that of the regular pattern in the defective portion. In such a repairing pattern as to make obtainable a graytone effect equal to the graytone effect of the regular pattern, the form of the repairing pattern is required not so much severely as compared with a case where the same form as that of the regular pattern is restored.

According to Arrangement 1, moreover, since the same form as that of the regular pattern is not restored, the trouble of restoring the same form as that of the regular pattern is saved, whereby it is possible to obviate a troublesome business arising from the operation of not only performing the position alignment but also varying the slit.

Thus, the repairing work can be done in a short time.

According to Arrangement 2, by removing a film in a portion containing opaque defects in the form and/or the disposition of achieving a graytone effect equal to the graytone effect of the regular pattern so as to form a repairing pattern different from the regular pattern, the operation of not only performing the position alignment but also varying the slit in conformity with each defect size to be corrected by means of a laser repair apparatus, that is, the troublesome and time-consuming operation that has heretofore been necessary for restoring the same form as that of the regular pattern by removing the whole opaque defective portion can be dispensed with.

According to Arrangement 3, by forming a repairing film in the form and/or the disposition of achieving a graytone effect equal to the graytone effect of the regular pattern so as to form a repairing pattern different from the regular pattern, the operation of not only performing the position alignment but also varying the slit of a laser CVD apparatus in conformity with each defect size to be corrected can be dispensed with, that is, the troublesome and time-consuming operation that has heretofore been necessary for restoring the same form as that of the regular pattern by filling up a clear defective portion.

According to Arrangement 4, by partially removing a repairing film in the form and/or the disposition of achieving a graytone effect equal to the graytone effect of the regular pattern after forming the repairing film in an area containing clear defects so as to form a repairing pattern different from the regular pattern, work and also working time can be made simpler and shorter than in Arrangement 3.

According to Arrangement 5, by pre-fixing the slit form, the operation of varying the slit can be dispensed with.

According to Arrangement 6, since a repairing film with the transmittance under control, any microscopic pattern of below or equal to the resolution limit of an exposure apparatus need not be formed.

According to Arrangement 7, it is unnecessary to make alignment of remaining portions of the opaque pattern that has undergone pattern-missing by removing the remaining portions thereof in the graytone part. Moreover, as a repairing pattern is uniformly formable over the whole defective area including an area with the pattern removed, a more uniform graytone effect is obtainable.

According to Arrangement 8, though there is no example wherein a translucent film is employed in a graytone mask for an ordinary semiconductor with the formation of a microscopic pattern of below or equal to the resolution limit of an exposure apparatus, assuming that there exists such a graytone mask as is formed with a microscopic pattern of below or equal to the resolution limit of an exposure apparatus, the graytone mask may be dealt with by the conventional method of defect repairing even when time and effort to a certain degree are needed as the mask size is small. In the case of a graytone mask for an LCD, however, the graytone mask therefor can hardly and actually be dealt with by the conventional method of defect repairing because it is large-sized and consequently has many defects. Therefore, the method of defect repairing according to the invention is indispensable for making a graytone mask for an LCD fit for practical use.

With the arrangements above, such a repairing pattern as makes obtainable a graytone effect equal to the graytone effect of the regular pattern has preferably ±15% of the transmittance of the regular pattern and more preferably ±10% thereof.

BRIEF DESCRIPTION OF THE DRAWINGS

FIG. 8A is a partial plan view; and FIG. 8B, a partial sectional view.

DESCRIPTION OF THE PREFERRED EMBODIMENTS

As a method of defect repairing in a graytone part in a graytone mask according to the invention, the following four methods will be given by way of example.

Embodiment 1
Spot Repairing of Opaque Defects

According to Embodiment 1 of the invention, a repairing pattern which is different from a regular pattern and makes obtainable a graytone effect equal to the graytone effect of the regular pattern is formed by not removing the whole opaque defective portion (a (short) bridge, a projection, etc.) in a graytone part in order to restore the same form as that of the regular pattern but partially removing a film in a portion containing the opaque defects in the form and/or the disposition of achieving a graytone effect equal to the graytone effect of the regular pattern by means of a laser repair apparatus.

Figure 1A:
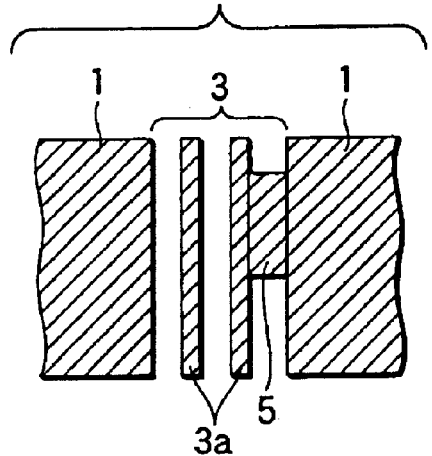
FIGS. 1A and 1B are partial plan views illustrating a method of opaque defect repairing in a graytone part according to Embodiment 1 of the invention.
Figure 1B:
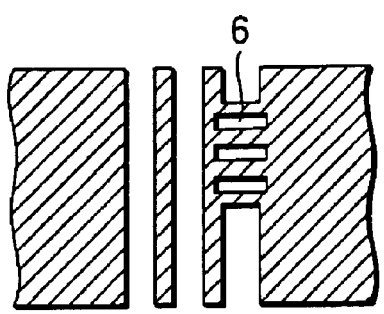

In case where a bridge (a short) 5 is produced in a graytone part 3 as shown in FIG. 1A, for example, a repairing pattern which makes obtainable a graytone effect equal to the graytone effect of the regular pattern is formed by partially and spottily removing the film in the portion containing the opaque defects by using laser shots (to form openings 6) as shown in FIG. 1B.

Figure 2A:
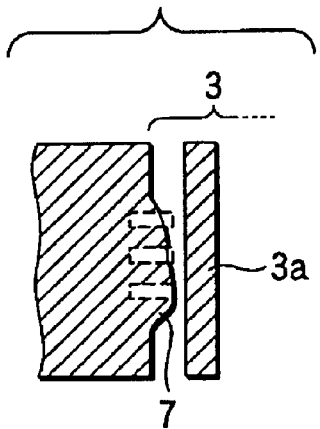
FIGS. 2A and 2B are partial plan views illustrating another method of opaque defect repairing in a graytone part according to Embodiment 1 of the invention.
Figure 2B:
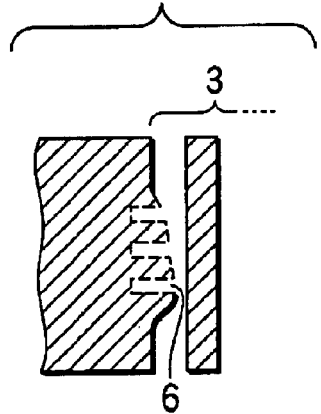

In case where a projection 7 is produced in the graytone part 3 as shown in FIG. 2A, a repairing pattern which makes obtainable a graytone effect equal to the graytone effect of the regular pattern is formed by partially and spottily removing the film in the portion containing the opaque defects by using laser shots (to form openings 6) as shown in FIG. 2B.

In these cases above, 'the film in the portion containing the opaque defects' also includes a opaque pattern 3a and a opaque part 1, whereby part of the opaque pattern 3a and part of the opaque part 1 are also removed. In other words, it is unnecessary to precisely align the edges of the opaque pattern 3a and the opaque part 1 with a slit in the laser repair apparatus. As the position of starting spotty removal of the film is not required to be strictly defined (i.e., may be roughly defined), the position alignment in the laser repair apparatus is simplified.

According to Embodiment 1 of the invention, repairs are preferably carried out by pre-fixing the slit form of achieving the graytone effect and the feeding pitch (interval) of the stage. The operation of varying the slit can be dispensed with by pre-fixing the slit form. The operation of performing the position alignment on and after the second line is unnecessitated by pre-fixing the feeding pitch of the stage. All of the defects of the same kind on the mask are more preferably repaired by pre-fixing the slit form and the feeding pitch of the stage. Incidentally, according to the invention, though repairs can be carried out by changing the slit form and the feeding pitch of the stage, the operation of changing not only the slit form but also the feeding pitch of the stage may become complicated.

Even in case where spot defects appear in the graytone part, repairs can also be effected with the slit form pre-fixed as stated above.

Embodiment 2
Spot Repairing of Clear Defects

According to Embodiment 2 of the invention, a repairing pattern which is different from a regular pattern and makes obtainable a graytone effect equal to the graytone effect of the regular pattern is formed by not filling up the whole clear defective portion (due to disconnection, pattern-missing, etc.) in a graytone part in order to restore the same form as that of the regular pattern but partially forming a thin chromium film by means of a laser CVD repair apparatus.

Figure 3A:
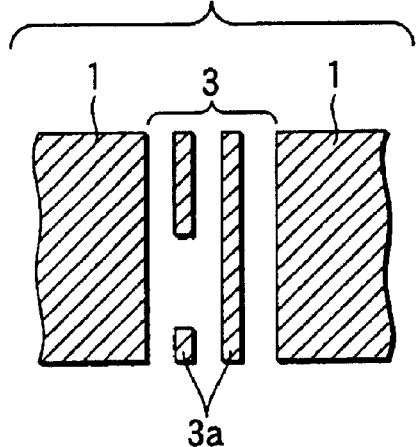
FIGS. 3A and 3B are partial plan views illustrating a method of clear defect repairing in a graytone part according to Embodiment 2 of the invention.
Figure 3B:
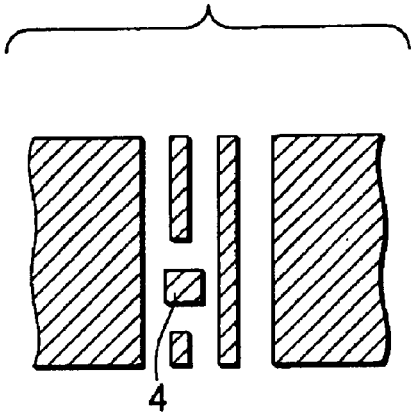

In case where the disconnection occurs in a opaque pattern 3a in a graytone part 3 as shown in FIG. 3A, a graytone effect equal to that of the regular pattern without any disconnection is made obtainable by spottily forming a repairing film 4 in the disconnected portion as shown in FIG. 3B (Embodiment 2-1). In this case, the size of the repairing film 4 may be set slightly greater than the line width of the opaque pattern 3a in order to acquire balance with respect to the amount of light transmitted therethrough from the spaces respectively produced on the upper and lower sides of the repairing film 4.

Figure 4A:
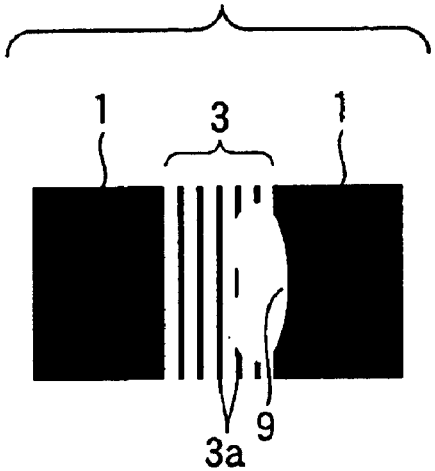
FIGS. 4A, 4B and 4C are partial plan views illustrating a method of clear defect repairing in a graytone part according to Embodiment 2 of the invention.
Figure 4B:
Figure 4C:
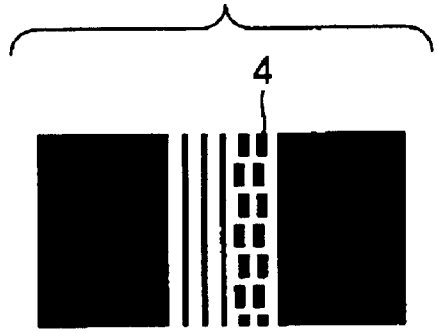

In case where the pattern-missing occurs in the opaque pattern 3a in the graytone part 3 as shown in FIG. 4A, the repairing film 4 is spottily formed and disposed to the smallest size that a film is reducible by the laser CVD apparatus as shown in FIG. 4B after the pattern on the periphery of the defective portion is removed if necessary as shown in FIG. 4B in order to form a corrective film pattern so that a graytone effect equal to the graytone effect of the regular pattern is achieved (Embodiment 2-2).

In these cases, as the form and position of spottily forming the repairing film 4 are not required to be strictly defined (i.e., may be roughly defined), the operation of not only performing the position alignment but also varying the slit in the laser CVD apparatus is simplified.

According to Embodiment 2 of the invention, repairs are preferably carried out by pre-fixing the film-forming size (slit form) and film-forming interval (feeding pitch of the stage) of achieving the graytone effect. The operation of varying the slit can be dispensed with by pre-fixing the slit form. The operation of performing the position alignment on and after the second line is unnecessitated by pre-fixing the feeding pitch of the stage. All of the defects of the same kind on the mask are more preferably repaired by pre-fixing the slit form and the feeding pitch of the stage.

Even in case where a cut (depression) is produced in the opaque pattern 3a in the graytone part, repairs may be carried out with the same pre-fixed film-forming size as stated above.

With respect to the ordinary depressed defect 9 of the opaque part 1, repairs can be carried out under the same method as before.

Embodiment 3

Other aspects of repairing clear defects will be described in Embodiment 3 of the invention.

Figure 5A:
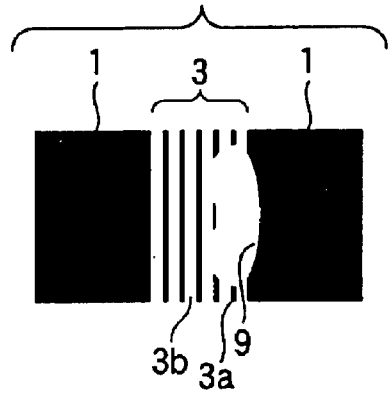
FIGS. 5A, 5B, 5C and 5D are partial plan views illustrating another method of clear defect repairing in a graytone part according to Embodiment 3 of the invention.
Figure 5B:
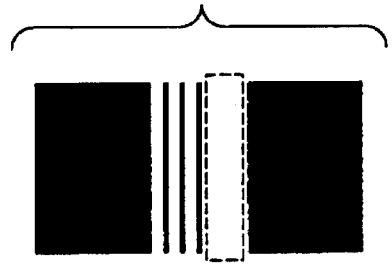
Figure 5C:
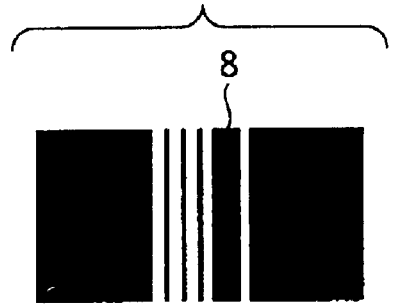
Figure 5D:
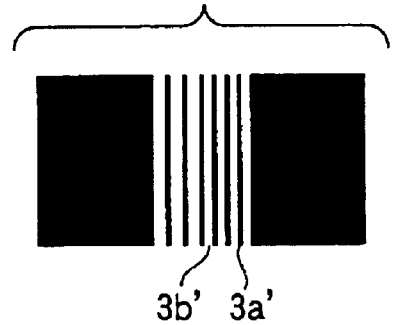

When pattern-missing occurs in a opaque pattern 3a in a graytone part 3 (line width=less than 3 $\mu$m and space width=less than 3 $\mu$m) as shown in FIG. 5A, for example, a repairing pattern which makes achievable a graytone effect equal to the graytone effect of a regular pattern is formed (FIG. 5D) through the steps of removing the remaining portions of the opaque pattern 3a that has undergone the pattern-missing (FIG. 5B), forming a repairing film 8 over the whole area with the pattern-missing (FIG. 5C), forming slit-like spaces 3b' at equal intervals by the laser repair apparatus in the repairing film 8 thus formed. In this case, the number of lines & spaces optionally varies with the area repairing.

When the slit width in the laser repair apparatus is minimized (e.g., 1 μm), the edge of opaque pattern 3a' is notched. When the slit width is set at 1.2–1.5 μm, the edge of the opaque pattern 3a' is in a straight line. The slit width in the laser repair apparatus is preferably set at 1.0–1.5 μm.

In case where the opaque pattern 3a' is so corrected as to have the same number of lines of the regular pattern, though the opaque pattern looks the same as the regular pattern, the opaque pattern is not exactly the same as the regular pattern because the line width and the space width 3b' of the opaque pattern 3a' and their positions differ from those in the regular pattern. When the number of lines is greater or smaller than that of the regular pattern, obviously the repairing pattern is not the same as the regular pattern.

According to Embodiment 3 of the invention, repairs are preferably carried out by pre-fixing the slit form (space form) and feeding pitch of the stage of achieving the graytone effect. The operation of varying the slit can be dispensed with by pre-fixing the slit form. The operation of performing the position alignment on and after the second line is unnecessitated by pre-fixing the feeding pitch of the stage. This method is one of the most preferable repairing methods. This is due to the fact that though the smallest processing slit width (i.e., the width of the space 3b') is not reducible so much, the feeding pitch of the stage can considerably be reduced (can be set at a unit of every 1 μm), so that by decreasing the line width of the opaque pattern 3a' and increasing the number of lines, for example, to prepare a pattern at a transmittance level equal to that of a opaque pattern of not exceeding the resolution limit of an exposure apparatus, it is possible to make repairs which make achievable a graytone effect equal to the graytone effect of the regular pattern. In comparison with the method of defect repairing according to Embodiment 2-2 above, the working is simple and does not take much time. Further, as no strict precision of positioning a repairing film 8 to be formed is required, the repairing film 8 is readily formed.

According to Embodiment 3 of the invention, all of the same defects as stated above are preferably made by pre-fixing the slit form and the feeding pitch of the stage.

With respect to the ordinary depressed defect 9 of the opaque part 1, repairs can be carried out under the same method as before.

Embodiment 4

Figure 6:
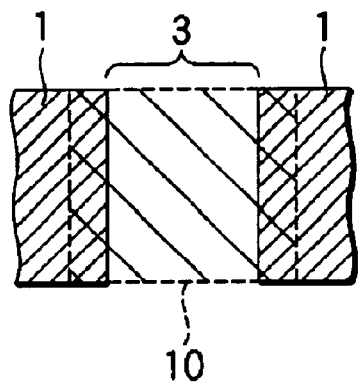
FIG. 6 is a partial plan view illustrating a method of clear defect repairing in a graytone part according to Embodiment 4 of the invention.

According to Embodiment 4 of the invention, in case where defects appear in a graytone part 3 as shown in FIG. 6, for example, a translucent film (halftone film) 10 is formed over the whole area of the graytone part 3 after a opaque pattern in the graytone part 3 is totally removed and the film material as well as the film thickness is used to control the transmittance of the translucent film 10 so that a graytone effect equal to the graytone effect of the regular pattern is obtainable (Embodiment 4-1).

Figure 7A:
FIGS. 7A and 7B are partial plan views illustrating another method of white repairing in a graytone part according to Embodiment 4 of the invention.
Figure 7B:
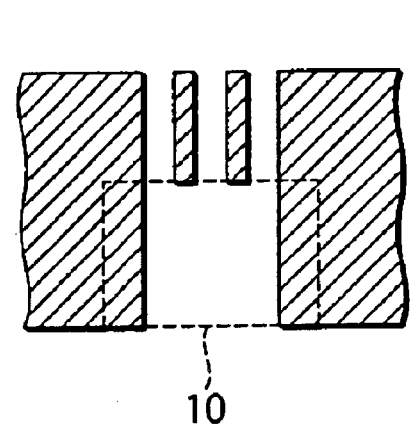
Figure 8A:
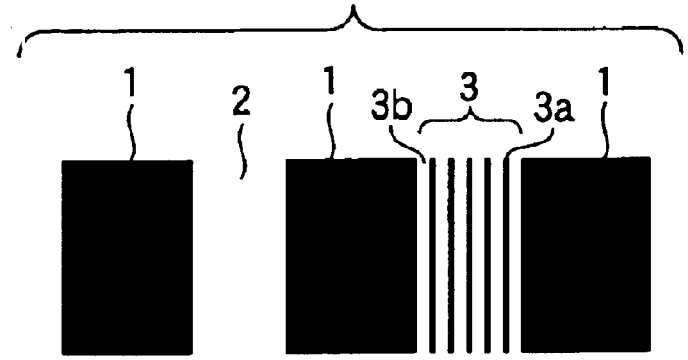
FIGS. 8A and 8B are diagrams illustrating a graytone mask.
Figure 8B:
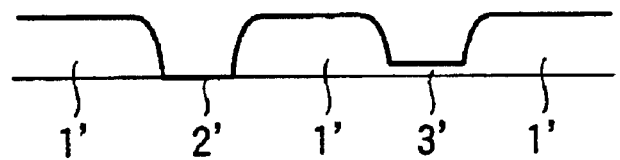

As shown in FIGS. 7A and 7B, moreover, such a translucent film 10 is formed in an area with the pattern-missing of the opaque pattern 3a, so that a graytone effect equal to the graytone effect of the regular pattern is made obtainable by the translucent film 10 (Embodiment 4-2).

According to Embodiment 4 of the invention, while part or the whole of the pattern of the graytone part subjected to defects, the translucent film is formed over the whole or part of the area of the graytone part so as to make obtainable a graytone effect equal to the graytone effect of the regular pattern (Embodiment 4-3).

As the material of the translucent film 10, molybdenum, tungsten, carbon and so forth may be used and when chemical resistance and adhesion strength are taken into consideration, any material containing chromium is preferred.

EXAMPLES

Graytone parts in graytone masks subjected to repairs according to Embodiments 1–4 of the invention were employed as examples for exposure tests by use of exposure devices for large-sized LCDs and it was confirmed that a graytone effect (effect of decreasing an amount of irradiation) equal to the graytone effect of a regular pattern was obtainable therefrom.

However, the invention is not limited to the aforementioned embodiments thereof.

Figure 9:
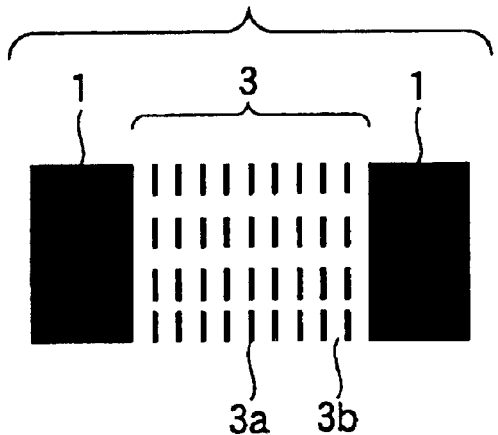
FIG. 9 is a partial plan view illustrating another aspect of the graytone part.
Figure 10A:
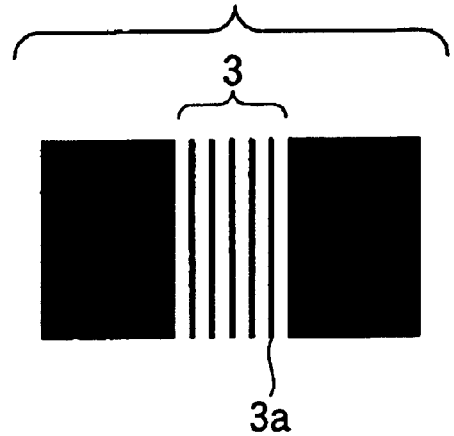
FIGS. 10A, 10B and 10C are partial plan views illustrating a conventional method of repairing a graytone part.
Figure 10B:
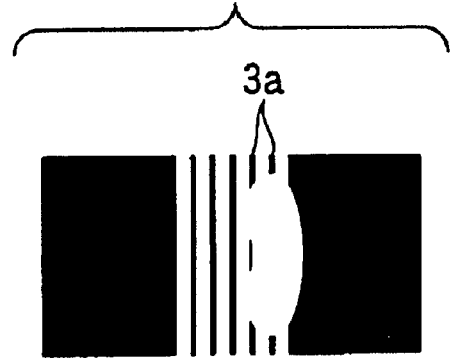
Figure 10C:
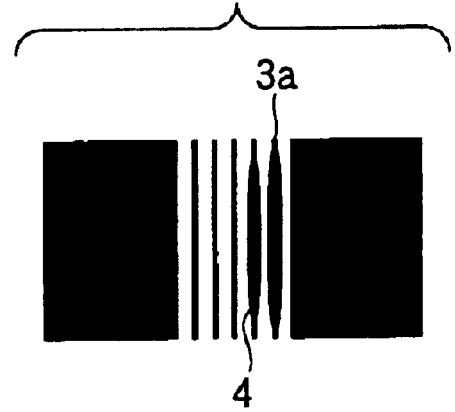

The invention is also applicable to a opaque pattern 3a of a dotted line type, for example, in a graytone part of FIG. 9.

As set forth above, the method of defect repairing according to the invention allows defects in a graytone part to be readily repaired, which defects are practically difficult to repair by the conventional method of defect repairing.

In particular, the method of defect repairing according to the invention is indispensable for making a graytone mask for an LCD fit for practical use.

What is claimed is:

1. A method of repairing a defect in a graytone mask, wherein the graytone mask comprises an opaque part, a transmission part and a graytone part including an opaque pattern, wherein the defect causes the graytone part to differ from an intended graytone part including an intended opaque pattern which does not exceed a resolution limit of an exposure apparatus using the intended graytone mask so that the intended graytone part has a graytone effect in which an amount of light transmitted through the intended graytone part is attenuated thereby selectively varying a thickness of a photoresist film to be exposed through the graytone mask, the method comprising forming a repairing pattern which structurally differs from the intended opaque pattern, wherein the graytone part with the repairing pattern provides a graytone effect substantially equal to the graytone effect of the intended graytone part.

2. The method of claim 1, wherein the defect is an opaque defect, and the step of forming the repairing pattern comprises removing at least a portion of an opaque film in an area including the opaque defect.

3. The method of claim 2, wherein the step of removing the portion of the opaque film comprises forming a slit in the opaque film using a laser repair apparatus.

4. The method of claim 1, wherein said defect is a clear area defect comprising a clear area in the opaque pattern of the graytone part, and the clear area corresponds to an opaque area of the intended opaque pattern of the intended graytone part which is not present in the opaque pattern of the graytone part, and the step of forming the repairing pattern comprises forming the repairing pattern in at least a portion of the clear area.

5. The method of claim 4, wherein the step of forming the repairing pattern comprises forming a slit using a laser chemical vapor deposition apparatus.

6. The method of claim 1, wherein said defect is a clear area defect comprising a clear area in the opaque pattern of the graytone part, and the clear area corresponds to an opaque area of the intended opaque pattern of the intended graytone part which is not present in the opaque pattern of the graytone part, and the step of forming the repairing pattern comprises:

forming the repairing film in at least a portion of the clear area; and removing at least a portion of the repairing film thereby forming the repairing pattern.

7. The method of claim 6, wherein the step of removing the portion of the repairing film comprises forming a slit in the repairing film using a laser repair apparatus.

8. The method of claim 1, wherein the graytone mask is a mask for a liquid crystal display.

9. The method of claim 1, wherein said repairing pattern includes at least a portion of the defect.

10. A method of repairing a clear area defect in a graytone mask, wherein the graytone mask comprises an opaque part, a transmission part and a graytone part including an opaque pattern, wherein the clear area defect causes the graytone part to differ from an intended graytone part including an intended opaque pattern which does not exceed a resolution limit of an exposure apparatus using the intended graytone mask so that the intended graytone part has a graytone effect in which an amount of light transmitted through the intended graytone part is attenuated thereby selectively varying a thickness of a photoresist film to be exposed through the graytone mask, wherein the clear area defect comprises a clear area in the opaque pattern of the graytone part, and the clear area corresponds to an opaque area of the intended opaque pattern of the intended graytone part which is not present in the opaque pattern of the graytone part, the method comprising forming a translucent film over at least a portion of the clear area, wherein the graytone part with the translucent film provides a graytone effect substantially equal to the graytone effect of the intended graytone part.

11. The method of claim 10, further comprising removing all of the opaque pattern of the graytone part prior to forming the translucent film.

12. The method of claim 10, wherein the graytone mask is a mask for a liquid crystal display.

13. A method of repairing a defect in a graytone mask, wherein the graytone mask comprises an opaque part, a transmission part and a graytone part including an opaque pattern, wherein the defect causes the graytone part to differ from an intended graytone part including an intended opaque pattern which does not exceed a resolution limit of an exposure apparatus using the intended graytone mask so that the intended graytone part has a graytone effect in which an amount of light transmitted through the intended graytone part is attenuated thereby selectively varying a thickness of a photoresist film to be exposed through the graytone mask, the method comprising:

removing at least a portion of the opaque pattern of the graytone part which includes the defect; and forming a translucent film over at least the portion of opaque pattern which was removed, wherein the graytone part with said translucent film provides a graytone effect substantially equal to the graytone effect of the intended graytone part.

14. The method of claim 13, wherein the graytone mask is a mask for a liquid crystal display.

* * * * *